United States Patent
Ando et al.

(10) Patent No.: US 7,345,345 B2
(45) Date of Patent: Mar. 18, 2008

(54) SEMICONDUCTOR DEVICE

(75) Inventors: Ryoichi Ando, Saitama (JP); Akira Uemoto, Gunma (JP); Toshio Kakiuchi, Gunma (JP)

(73) Assignee: Sanyo Electric Co., Ltd., Moriguchi-shi (JP)

( * ) Notice: Subject to any disclaimer, the term of this patent is extended or adjusted under 35 U.S.C. 154(b) by 127 days.

(21) Appl. No.: 10/910,768

(22) Filed: Aug. 4, 2004

(65) Prior Publication Data
US 2005/0045953 A1 Mar. 3, 2005

(30) Foreign Application Priority Data
Aug. 6, 2003 (JP) ............................. 2003-288153

(51) Int. Cl.
*H01L 23/62* (2006.01)
(52) U.S. Cl. ...................................... 257/357; 257/355
(58) Field of Classification Search ................ 257/357, 257/355
See application file for complete search history.

(56) References Cited

U.S. PATENT DOCUMENTS

| | | | |
|---|---|---|---|
| 4,761,571 A * | 8/1988 | Golke et al. .................. 326/31 |
| 5,689,258 A * | 11/1997 | Nakamura et al. ........... 341/136 |
| 6,242,294 B1 | 6/2001 | Mitani et al. | |
| 6,432,761 B1 * | 8/2002 | Gerber et al. ................ 438/217 |
| 6,727,573 B2 | 4/2004 | Mitani et al. | |
| 2001/0015460 A1 | 8/2001 | Mitani et al. | |
| 2003/0235083 A1* | 12/2003 | Swift et al. ............. 365/185.29 |

FOREIGN PATENT DOCUMENTS

| JP | 11-186405 | 7/1999 |
|---|---|---|
| JP | 2002-222869 | 8/2002 |
| KR | 1999-0062383 | 7/1999 |
| KR | 2000-0041323 | 7/2000 |

* cited by examiner

*Primary Examiner*—Long Pham
(74) *Attorney, Agent, or Firm*—Morrison & Foerster LLP

(57) ABSTRACT

A CMOS semiconductor device having a triple well structure which can block latch-up by preventing parasitic thyristors from turning on is offered with reduced layout area. The CMOS semiconductor device includes a P-type silicon substrate, a first and a second deep N-type wells formed in a surface of the P-type silicon substrate and separated from each other, a P-type well formed in the first deep N-type well, a shallow N-type well formed in the second deep N-type well, an N-channel type MOS transistor formed on a surface of the P-type well and a P-channel type MOS transistor formed on a surface of the shallow N-type well.

4 Claims, 5 Drawing Sheets

SEMICONDUCTOR DEVICE

CROSS-REFERENCE OF THE INVENTION

This invention is based on Japanese Patent Application No. 2003-288153, the content of which is incorporated herein by reference in its entirety.

BACKGROUND OF THE INVENTION

1. Field of the Invention

This invention relates to a CMOS semiconductor device, specifically to a protection against latch-up in a CMOS semiconductor device having a triple well structure.

2. Description of the Related Art

The CMOS semiconductor device having the triple well structure has been known to the industry. FIG. 4 is a cross-sectional view showing a structure of the CMOS semiconductor device having the triple well structure.

A reference numeral 20 denotes a P-type silicon substrate. A deep N-type well 21 is formed in a surface of the P-type silicon substrate 20. A P-type well 22 is formed in the deep N-type well 21. A shallow N-type well 23 is formed in a surface of the deep N-type well 21 and is disposed adjacent the P-type well 22. N+ regions 24 are formed in a peripheral surface of the deep N-type well 21. A power supply electric potential VDD is applied to the N+ regions 24.

An N-channel type MOS transistor Mn is formed on a surface of the P-type well 22 while a P-channel type MOS transistor Mp is formed on a surface of the shallow N-type well 23.

The N-channel type MOS transistor Mn is composed of a drain 27, a gate oxide film, a gate electrode 28 and a source 29 formed in or on the surface of the P-type well 22. P+ regions 25 are formed in the surface of the P-type well 22. The P+ regions 25 are connected to a ground electric potential VSS and set an electric potential of the P-type well 22 at the ground electric potential VSS.

The P-channel type MOS transistor Mp is composed of a source 30, a gate oxide film, a gate electrode 31 and a drain 32 formed in or on the surface of the deep N-type well 21. The N+ regions 26 are connected to the power supply electric potential VDD and set an electric potential of the shallow N-type well 23 at the power supply electric potential VDD.

The p-type well 22 and the shallow N-type well 23 are formed in the single deep N-type well 21 in the conventional CMOS semiconductor device having the triple well structure, as described above.

The conventional CMOS semiconductor device having the triple well structure is accompanied with a parasitic thyristor and has a problem that it is vulnerable to latch-up. The problem is described in detail hereafter.

A parasitic bipolar transistor Bip41 is formed between the shallow N-type well 23, the source 30 and the p-type well 22, as shown in FIG. 4. The shallow N-type well 23 makes a base, the source 30 makes an emitter and the p-type well 22 makes a collector of the PNP-type bipolar transistor Bip41.

Another parasitic bipolar transistor Bip42 is formed between the P-type well 22, the source 29 and the shallow N-type well 23. The P-type well 22 makes a base, the source 29 makes an emitter and the shallow N-type well 23 makes a collector of the NPN-type bipolar transistor Bip42.

Consequently, as shown in FIG. 5, the parasitic bipolar transistor Bip41 combined with the parasitic bipolar transistor Bip42 forms the parasitic thyristor which would cause latch-up. Thus, a base width WB1 of the bipolar transistor Bip41 and a base width WB2 of the bipolar transistor Bip42 have been enlarged in the conventional art as a countermeasure against the latch-up. When the base widths are enlarged, however, it takes larger area to layout the device.

This invention is directed to protecting the CMOS semiconductor device having the triple well structure against latch-up by preventing the parasitic thyristor from turning on while reducing the layout area of the device.

SUMMARY OF THE INVENTION

A CMOS semiconductor device of this invention having a triple well structure includes deep N-type wells separated from each other. The separated deep N-type wells provide the device with enhanced strength against latch-up by preventing a parasitic thyristor from turning on.

DETAILED DESCRIPTION OF THE INVENTION

Next, an embodiment of this invention will be explained in detail referring to figures hereinafter.

Figure 1:
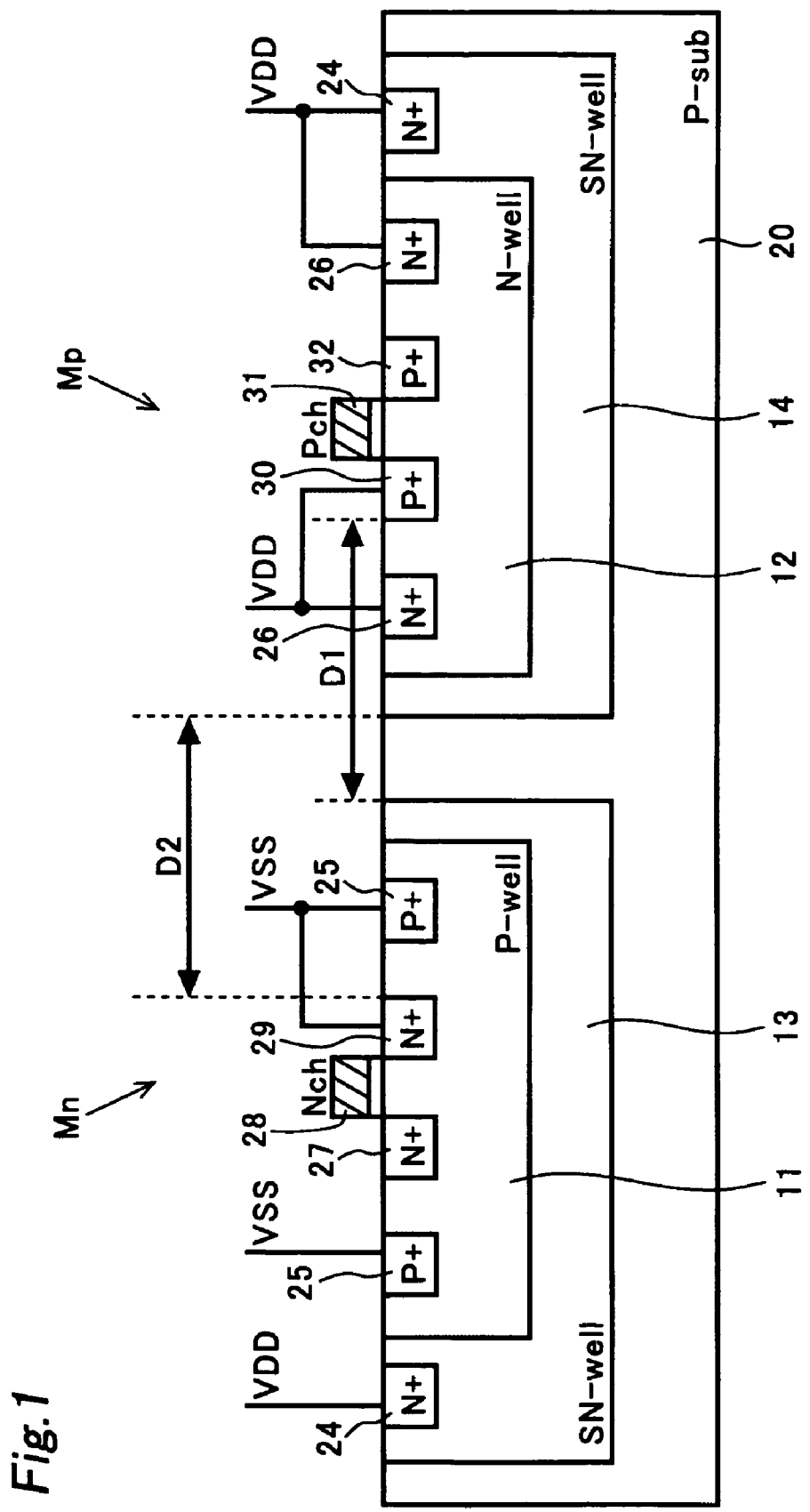
FIG. 1 is a cross-sectional view showing a CMOS semiconductor device having a triple well structure according to an embodiment of this invention.

FIG. 1 is a cross-sectional view showing a CMOS semiconductor device according to the embodiment.

Figure 4:
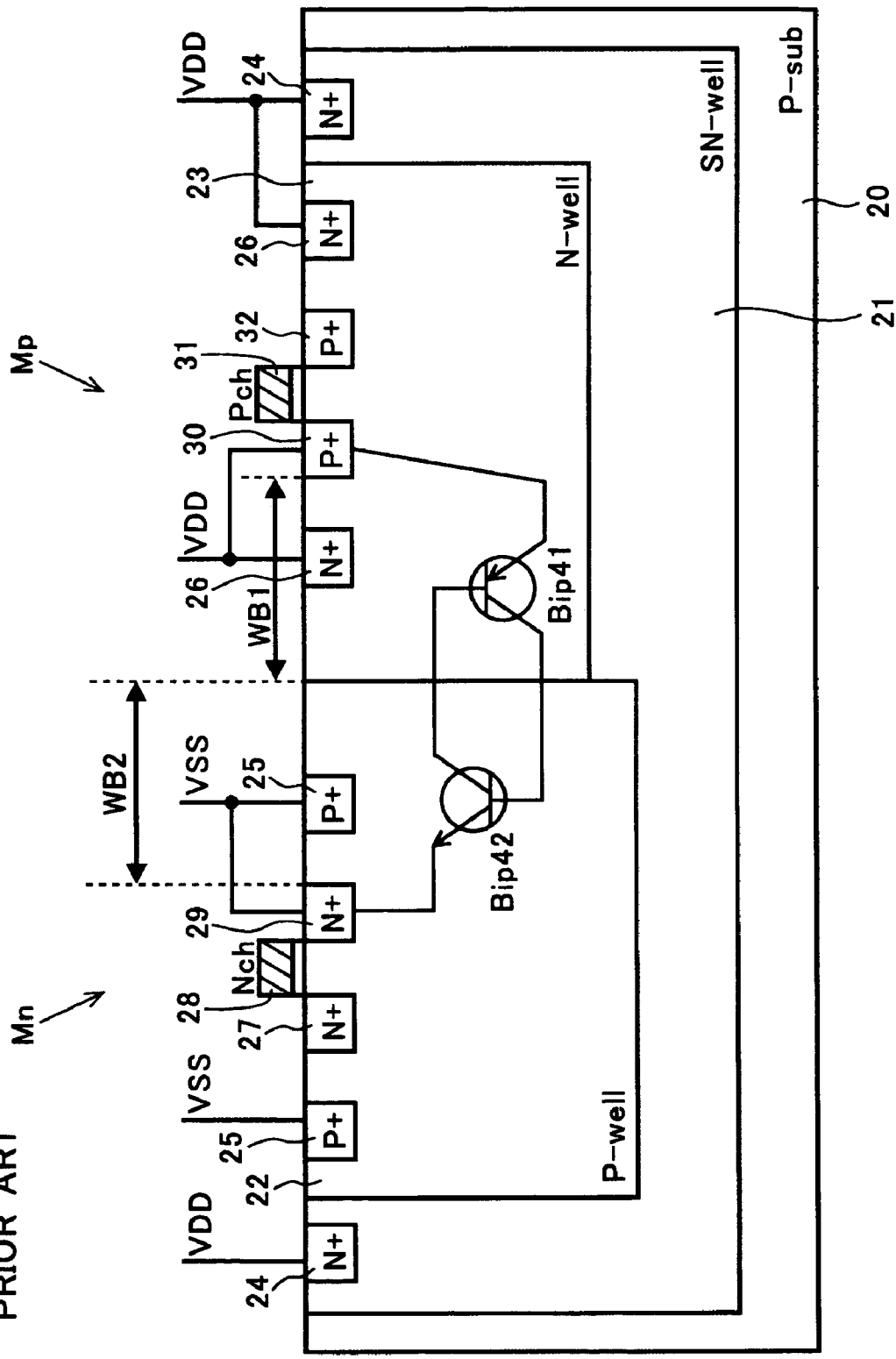
FIG. 4 is a cross-sectional view showing a CMOS semiconductor device having a triple well structure according to a conventional art.
Figure 5:
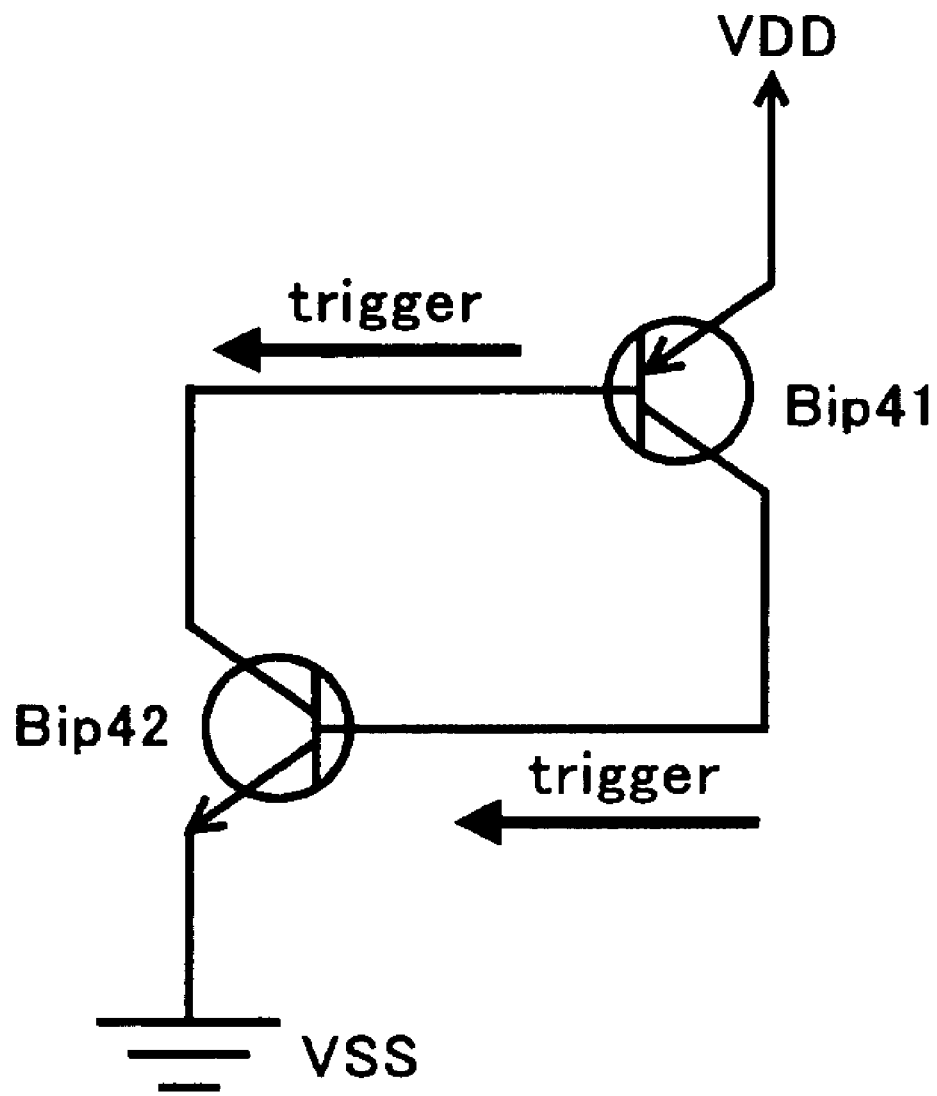
FIG. 5 is a circuit diagram showing connections of parasitic bipolar transistors in the triple well structure according to the conventional art.

The same components in FIG. 1 as in FIG. 4 have the same symbols, and the explanations thereof are omitted. A deep N-type well 13 is formed in a surface of the P-type silicon substrate 20. A P-type well 11 is formed in the deep N-type well 13. A deep N-type well 14 is formed in a surface of the P-type silicon substrate 20. A shallow N-type well 12 is formed in the deep N-type well 14. An N-channel type MOS transistor Mn is formed on a surface of the P-type well 11 while a P-channel type MOS transistor Mp is formed on a surface of the shallow N-type well 12. The semiconductor device of this invention does not necessarily include the deep N-type well 14, and the deep N-type well 14 may be omitted.

This embodiment has two deep N-type wells 13 and 14 separated from each other. Because of this structure, a parasitic thyristor can be prevented from turning on and latch-up can be blocked. In addition, the area to layout the device can be reduced since latch-up can be prevented without enlarging distances D1 and D2, which correspond to the base widths WB1 and WB2 of the conventional art, respectively. (WB1>D1, WB2>D2) The reasons why the parasitic thyristor is prevented from turning on in this embodiment will be explained in detail hereinafter.

Figure 2:
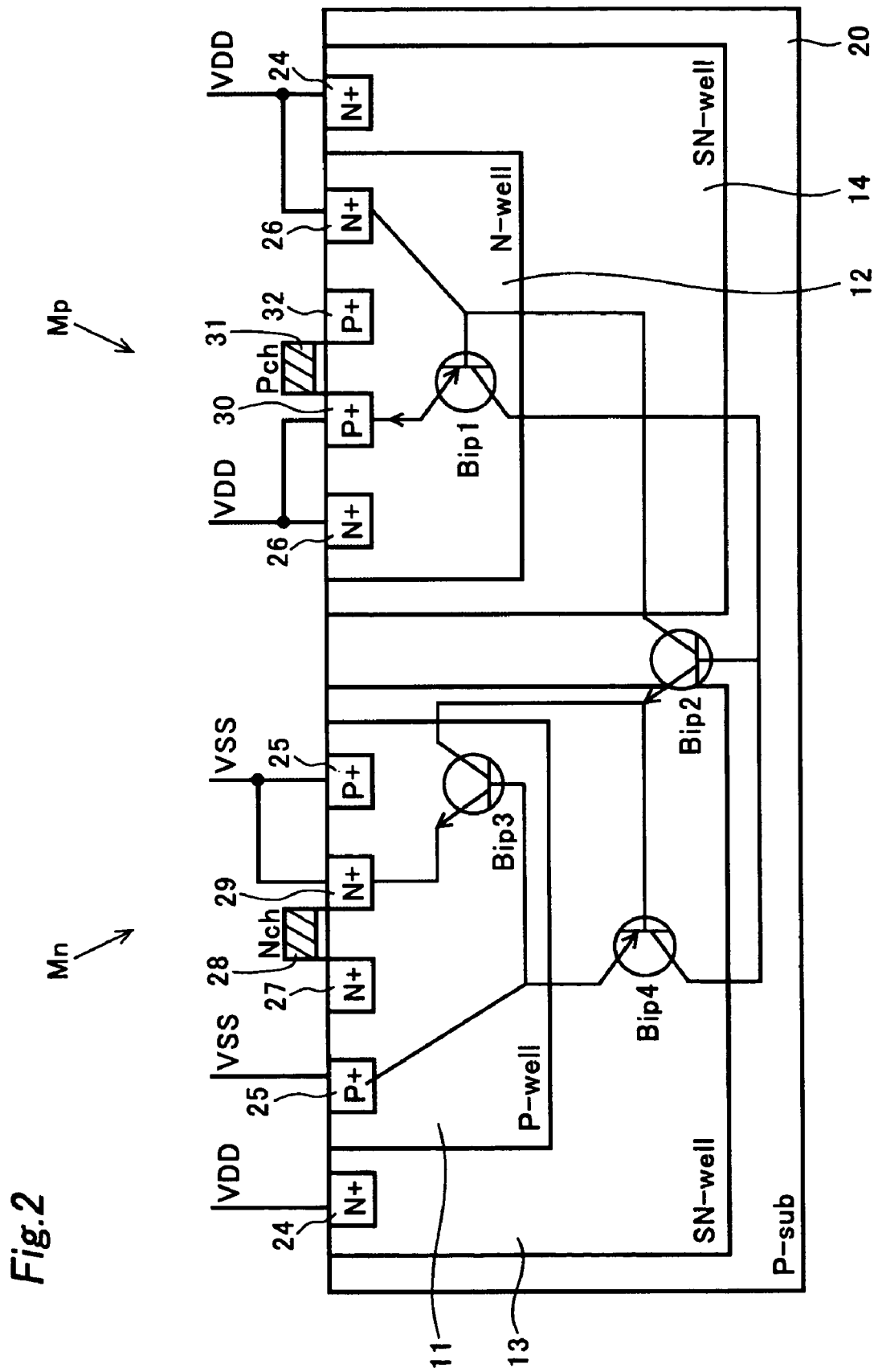
FIG. 2 is a cross-sectional view showing the CMOS semiconductor device having the triple well structure according to the embodiment of this invention.
Figure 3:
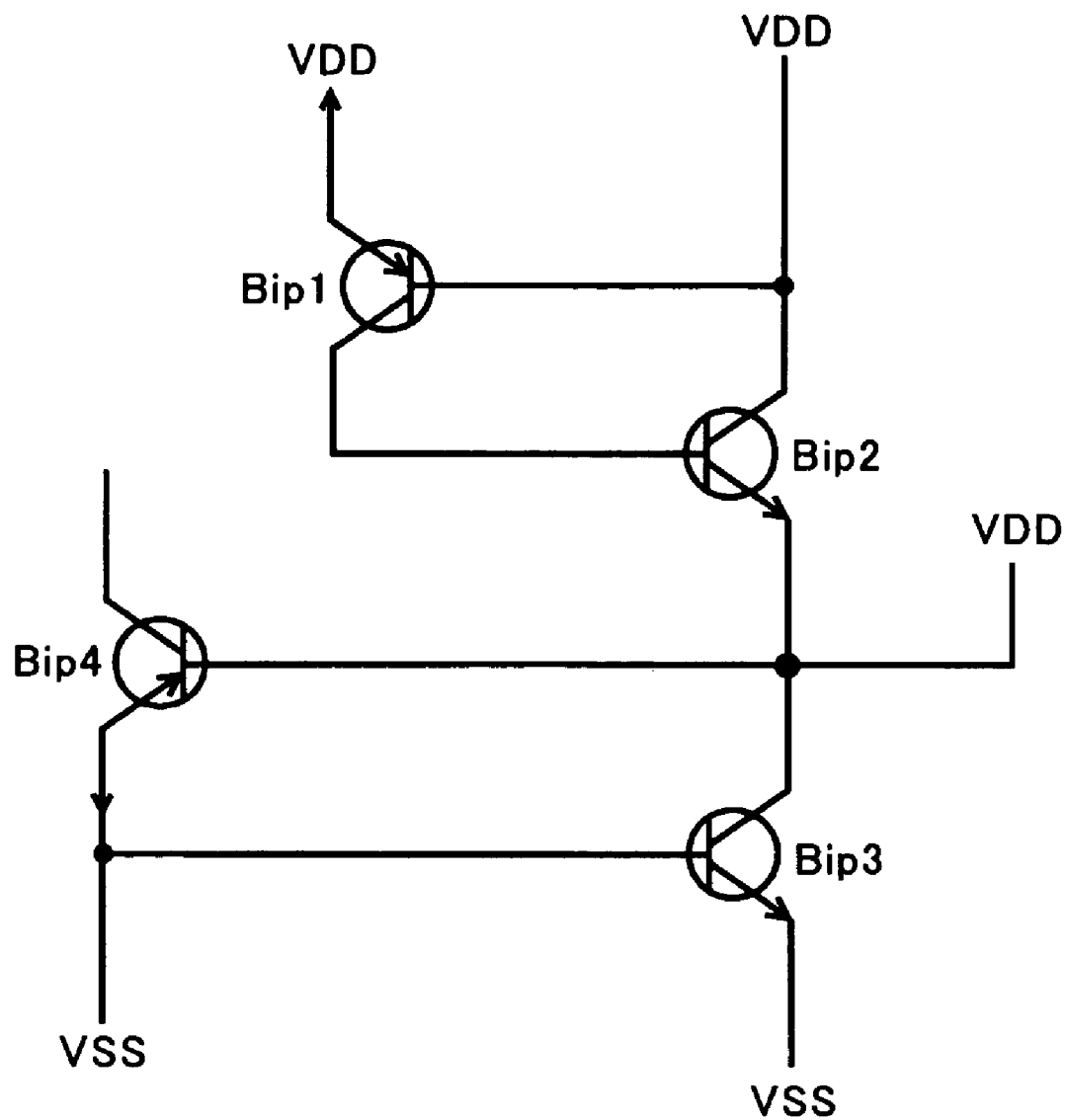
FIG. 3 is a circuit diagram showing connections of parasitic bipolar transistors in the triple well structure according to the embodiment of this invention.

FIG. 2 is a cross-sectional view showing the formation of the parasitic bipolar transistors. FIG. 3 is a circuit diagram showing connections of the parasitic bipolar transistors shown in FIG. 2.

Parasitic bipolar transistors Bip1, Bip2, Bip3 and Bip4 are shown in FIG. 2 and also in FIG. 3.

The parasitic bipolar transistor Bip1 is formed between the shallow N-type well 12, the deep N-type well 14, a source 30 and the P-type silicon substrate 20. The shallow N-type well 12 and the deep N-type well 14 make a base, the source 30 makes an emitter and the P-type silicon substrate 20 makes a collector of the PNP-type bipolar transistor Bip1.

Also the parasitic bipolar transistor Bip2 is formed between the P-type silicon substrate 20, the deep N-type well 13, the shallow N-type well 12 and the deep N-type well 14. The P-type silicon substrate 20 makes a base, the deep N-type well 13 makes an emitter and the shallow N-type well 12 and the deep N-type well 14 make a collector of the NPN-type bipolar transistor Bip2.

The parasitic bipolar transistor Bip3 is formed between the P-type well 11, the source 29 and the deep N-type well 13. The P-type well 11 makes a base, the source 29 makes an emitter and the deep N-type well 13 makes a collector of the NPN-type bipolar transistor Bip3.

Furthermore, the parasitic bipolar transistor Bip4 is formed between the deep N-type well 13, the P-type well 11 and the P-type silicon substrate 20. The deep N-type well 13 makes a base, the P-type well 11 makes an emitter and the P-type silicon substrate 20 makes a collector of the PNP-type bipolar transistor Bip4.

A parasitic thyristor is formed of the parasitic transistors Bip1 and Bip2. However, the parasitic thyristor does not turn on because both ends of the first thyristor are at power supply electric potential VDD. Therefore, latch-up can be prevented from occurring while the area required to layout the device is reduced. The deep N-type wells 13 and 14 are biased at the same electric potential VDD in the embodiment.

Latch-up is prevented from occurring in the embodiment, since the two deep N-type wells 13 and 14 are separated from each other and biased at the same electric potential.

According to this invention, latch-up can be prevented in the CMOS semiconductor device having triple well structure with reduced layout area.

What is claimed is:

1. A CMOS semiconductor device comprising:
a semiconductor substrate of a first conductivity type;
a first well of a second conductivity type formed in a surface portion of the semiconductor substrate;
a second well of the second conductivity type formed in the surface portion of the semiconductor substrate, the second well being separated from the first well;
a third well of the first conductivity type formed in a surface portion of the first well;
a fourth well of the second conductivity type formed in a surface portion of the second well;
a MOS transistor comprising a channel of the second conductivity type formed in a surface portion of the third well; and
a MOS transistor comprising a channel of the first conductivity type formed in a surface portion of the fourth well,
wherein the first well and the second well are biased at the same electric potential, and a source of the MOS transistor in the third well and a source of the MOS transistor in the fourth well are biased at different electric potentials.

2. A CMOS semiconductor device comprising:
a semiconductor substrate of a first conductivity type;
a first well of a second conductivity type formed in a surface portion of the semiconductor substrate;
a second well of the second conductivity type formed in the surface portion of the semiconductor substrate, the second well being separated from the first well;
a third well of the first conductivity type formed in a surface portion of the first well;
a MOS transistor comprising a channel of the second conductivity type formed in a surface portion of the third well; and
a MOS transistor comprising a channel of the first conductivity type formed in a surface portion of the second well,
wherein the first well and the second well are biased at the same electric potential, and a source of the MOS transistor in the third well and a source of the MOS transistor in the second well are biased at different electric potentials.

3. The MOS semicondcutor device of claim 1, further comprising a first high impurity region formed in the surface portion of the first well which has higher impurities of the second conductivity type than the first well and second high impurity region formed in the surface portion of the second well which has higher impurities of the second conductivity type than the second well, wherein the first and second high impurity regions are configured to receive said same electric potential.

4. The MOS semicondcutor device of claim 2, further comprising a first high impurity region formed in the surface portion of the first well which has higher impurities of the second conductivity type than the first well and second high impurity region formed in the surface portion of the second well which has higher impurities of the second conductivity type than the second well, wherein the first and second high impurity regions are configured to receive said same electric potential.

* * * * *